(12) United States Patent
Murakami et al.

(10) Patent No.: US 8,476,568 B2
(45) Date of Patent: Jul. 2, 2013

(54) SOLID-STATE IMAGING DEVICE THAT ADJUSTS FREQUENCY OF A CLOCK TO CHANGE A GAIN OF A COUNTER TO A DETERMINED GAIN

(75) Inventors: Masashi Murakami, Kyoto (JP); Kenichi Shimomura, Hyogo (JP)

(73) Assignee: Panasonic Corporation, Osaka (JP)

( * ) Notice: Subject to any disclaimer, the term of this patent is extended or adjusted under 35 U.S.C. 154(b) by 314 days.

(21) Appl. No.: 12/832,684

(22) Filed: Jul. 8, 2010

(65) Prior Publication Data

US 2010/0277632 A1   Nov. 4, 2010

Related U.S. Application Data

(62) Division of application No. 12/261,393, filed on Oct. 30, 2008, now Pat. No. 7,777,170.

(30) Foreign Application Priority Data

Dec. 25, 2007 (JP) ................................. 2007-332503

(51) Int. Cl.
 *H01L 27/00* (2006.01)
 *H03M 1/34* (2006.01)

(52) U.S. Cl.
 USPC ....................................... 250/208.1; 341/164

(58) Field of Classification Search
 USPC ......... 250/208.1, 214.1, 214 R, 206, 214 AG, 250/214 C; 348/241, 294, 308, 302, 229.1, 348/230.1; 341/155, 164
 See application file for complete search history.

(56) References Cited

U.S. PATENT DOCUMENTS

| 5,168,528 | A | 12/1992 | Field |
| 6,992,706 | B2 | 1/2006 | Mabuchi et al. |
| 7,088,279 | B2 | 8/2006 | Muramatsu et al. |
| 7,129,883 | B2 | 10/2006 | Muramatsu et al. |
| 7,156,486 | B2 | 1/2007 | Eguchi et al. |
| 7,315,273 | B2 | 1/2008 | Muramatsu et al. |

(Continued)

FOREIGN PATENT DOCUMENTS

| JP | 07-302500 | 11/1995 |
| JP | 2002-185328 | 6/2002 |

(Continued)

OTHER PUBLICATIONS

JP 2004112741 Machine Translation of entire publication sent in Applicant's IDS. Dated Apr. 8, 2004.*

(Continued)

*Primary Examiner* — Que T Le
*Assistant Examiner* — Jennifer Bennett
(74) *Attorney, Agent, or Firm* — McDermott Will & Emery LLP

(57) ABSTRACT

A solid-state imaging device comprises a pixel array; a reference signal generation unit operable to generate a reference signal that changes monotonically for a predetermined period in a horizontal period; a comparator operable to compare the level of a pixel signal with the level of a reference signal; a counter operable to count input clock pulses; a memory operable to store the number of counts counted by the counter as a digital value; and a timing control unit operable to generate a clock that is to be input into the counter, and change frequency of the clock that is to be input into the counter based on external input data.

17 Claims, 18 Drawing Sheets

U.S. PATENT DOCUMENTS

| | | |
|---|---|---|
| 7,324,033 B2 | 1/2008 | Asayama et al. |
| 2002/0109620 A1 | 8/2002 | Sakuragi |
| 2002/0122129 A1 | 9/2002 | Lee |
| 2004/0016919 A1 | 1/2004 | Daiku et al. |
| 2004/0017493 A1 | 1/2004 | Daiku et al. |
| 2004/0017495 A1 | 1/2004 | Funakoshi et al. |
| 2004/0119853 A1 | 6/2004 | Kokubun et al. |
| 2004/0119854 A1 | 6/2004 | Funakoshi et al. |
| 2004/0119856 A1 | 6/2004 | Nishio et al. |
| 2004/0119859 A1 | 6/2004 | Nishio et al. |
| 2005/0041128 A1 | 2/2005 | Baker |
| 2006/0012698 A1 | 1/2006 | Nitta et al. |
| 2006/0013485 A1 | 1/2006 | Nitta et al. |
| 2006/0164529 A1 | 7/2006 | Shimizu |
| 2007/0188367 A1 | 8/2007 | Yamada |
| 2007/0194962 A1* | 8/2007 | Asayama et al. ............. 341/144 |
| 2008/0043128 A1* | 2/2008 | Poonnen et al. ............. 348/294 |
| 2008/0170137 A1* | 7/2008 | Matsumoto et al. .......... 348/241 |
| 2008/0252756 A1 | 10/2008 | Nishio et al. |

FOREIGN PATENT DOCUMENTS

| | | |
|---|---|---|
| JP | 2003-219279 | 7/2003 |
| JP | 2004-112741 A | 4/2004 |
| JP | 2004-158958 | 6/2004 |
| JP | 2004-159160 | 6/2004 |
| JP | 2005-323331 | 11/2005 |
| JP | 2006-033452 | 2/2006 |
| JP | 2007-214959 | 8/2007 |

OTHER PUBLICATIONS

Japanese Office Action issued in Japanese Patent Application No. JP 2007-332503 dated May 8, 2012.

Japanese Office Action issued in Japanese Patent Application No. 2007-332503 mailed Oct. 23, 2012.

* cited by examiner

SOLID-STATE IMAGING DEVICE THAT ADJUSTS FREQUENCY OF A CLOCK TO CHANGE A GAIN OF A COUNTER TO A DETERMINED GAIN

RELATED APPLICATIONS

This application is a Divisional of U.S. application Ser. No. 12/261,393, filed on Oct. 30, 2008 now U.S. Pat. No. 7,777,170, claiming priority of Japanese Patent Application No. 2007-332503, filed on Dec. 25, 2007, the entire contents of each of which are hereby incorporated by reference.

BACKGROUND OF THE INVENTION (1) Field of the Invention

The present invention relates to a solid-state imaging device and a camera, and in particular to a MOS type solid-state imaging device such as a CMOS image sensor.

(2) Description of the Related Art

In recent years, various methods have been suggested for reading signals in a CMOS image sensor. Generally speaking, commonly used are CMOS image sensors of a column parallel output type in which a row of pixels is selected in a pixel array. Then, pixel signals generated in the selected pixels are read in parallel via a vertical signal line (also referred to as a column signal line). An image sensor that has also been suggested is of a column A/D type, which is provided with an A/D conversion circuit for each vertical signal line, so that a pixel signal is converted from analog to digital form inside the CMOS image sensor.

FIG. 15 is a schematic construction diagram of an image sensor shown in Japanese laid-open patent application No. 2005-323331 (hereinafter referred to as "Conventional technique 1").

An image sensor 1 includes a pixel array 10, a drive control unit 7, a column processing unit 26, a reference signal generation unit 27, and an output circuit 28. The pixel array 10 is composed of a plurality of pixels 3 arranged in rows and columns. The drive control unit 7 is arranged on the periphery of the pixel array 10. The column processing unit 26 is composed of column A/D circuits arranged in correspondence with the columns of the pixel array 10. The reference signal generation unit 27 generates a reference signal RAMP whose level temporally changes with a predetermined rate of change.

The drive control unit 7 is composed of a horizontal scanning circuit (column scanning circuit) 12, a vertical scanning circuit (row scanning circuit) 14, and a timing control unit 40. The timing control unit 40 generates various kinds of internal clocks based on a master clock CLK0 input via a terminal 5a, and supplies the generated internal clocks for each circuit inside the image sensor 1.

Each of the pixels is connected to a row control line 15 derived from the vertical scanning circuit 14, and a vertical signal line 19 for transmitting a pixel signal to the column processing unit 26.

The column A/D circuit 25 includes a comparator 252, a counter 254, and a memory 256. The comparator 252 compares the level of the reference signal RAMP received from the reference signal generation unit 27 with the level of the pixel signal received from the pixel 3 via the vertical signal lines 19 (H0, H1, ...). The counter 254 counts input clock pulses. The memory 256 stores a digital value of the level of the pixel signal. The digital value is a difference between (i) a count value indicated by the counter 254 at a start of a predetermined period included in a horizontal period and (ii) a count value indicated by the counter 254 when the comparator 252 of a corresponding column shows coincidence between the level of the pixel signal and the level of the reference signal. This difference is referred to as "the number of counts counted by the counter" hereinafter. The pixel signal stored in the memory 256 is output outside by the horizontal scanning circuit 12 via the output circuit 28.

The following describes the operation of the image sensor shown in the conventional technique 1, particularly the operation when the pixel signal is A/D converted by the column A/D circuit 25.

FIG. 16 is a timing chart showing the operation of the image sensor according to the conventional technique 1.

The timing control unit 40 resets the counter 254 so that the count value of the counter 254 becomes its initial value "0", and sets the counter 254 to a count-down mode. Also, the timing control unit 40 causes the pixel 3 in an arbitrary row Hx to read a pixel signal having a reset component ΔV. The pixel signals appear in the vertical signal lines 19 (H1, H2, ... Hm) respectively. The timing control unit 40 supplies control data CN4 for the reference signal generation unit 27, when the pixel signals of the vertical signal lines 19 are stabilized (time t10). Upon receipt of the control data CN4, the reference signal generation unit 27 starts changing the level of the reference signal RAMP for the predetermined period included in the horizontal period. At the same time, the timing control unit 40 starts inputting a clock CK0 into the counter 254 (time t10). Upon receipt of the clock CK0, the counter 254 starts counting down from the initial value "0".

The level of the reference signal RAMP changes for the predetermined period included in the horizontal period, and coincides with the reset component ΔV at a certain time (time t12). At this time, an output signal of the comparator 252 is inverted, which causes the counter 254 to stop counting down. A count value indicated by the counter 254 at this time is equivalent to the level of the reset component ΔV.

When a period for the count down elapses (time t14), the timing control unit 40 stops supplying the control data CN4 to the reference signal generation unit 27, and also stops inputting the clock CK0 into the counter 254.

Then, the timing control unit 40 sets the counter 254 to a count-up mode, and causes the pixel 3 in the row Hx to read a pixel signal having a signal component Vsig. A method for reading the pixel signal is the same as that for reading the reset component ΔV, except that the counter 254 is set to the count-up mode. As described above, the counter 254 is set to the count-down mode when the reset component ΔV is read, and set to the count-up mode when the signal component Vsig is read. In this way, a subtraction is automatically performed in the counter 254, thereby obtaining a count value equivalent to the level of the signal component Vsig.

The following describes an image sensor shown in the Japanese laid-open patent application No. 2006-33452 (hereinafter referred to as "Conventional technique 2").

FIG. 17 is a schematic construction diagram of the image sensor shown in the conventional technique 2.

In the image sensor shown in the conventional technique 2, a clock CKdac that is supplied for the reference signal generation unit 27 is different from the clock CK0 that is input into the counter 254. A DAC 27a counts the clock CKdac, and reduces the voltage of the reference signal RAMP by ΔRAMP for each count. The amount of change per count ΔRAMP is set based on data indicating a slope of the reference signal RAMP (rate of a temporal change) included in the control data CN4.

FIG. 18 shows in detail the reference signal RAMP and the clock in the conventional technique 2.

The timing control unit 40 supplies the clock CK0 for the counter 254, and also selectively supplies, for the reference signal generation unit 27, a clock CKdac1 having the same frequency as the clock CK0, a clock CKdac2 having a frequency obtained by dividing the frequency of the clock CK0 by 2, and a clock CKdac4 obtained by dividing the frequency of the clock CK0 by 4. In this way, a reference signal RAMP1 is generated when the clock CKdac1 is supplied, a reference signal RAMP2 is generated when the clock CKdac2 is supplied, and a reference signal RAMP4 is generated when the clock CKdac4 is supplied. When the frequency of the clock CKdac is divided by 1/m (m is an integer), the slope of the reference signal RAMP is multiplied by 1/m, and the number of counts counted by the counter 254 is multiplied by m. This is equivalent to the gain being multiplied by m.

In the image sensor shown in the conventional technique 2, it is possible to change the gain when necessary, by appropriately changing the frequency of the clock CKdac that is input into the reference signal generation unit 27. However, the construction of the image sensor according to the conventional technique 2 is not fully satisfactory in terms of reducing the power consumption of the image sensor as a whole.

The reference signal generation unit 27 is driven by one of the clock CKdac1 having the same frequency as a reference frequency, the clock CKdac2 having a frequency of ½ of the reference frequency, and the clock CKdac4 having a frequency of ¼ of the reference frequency. On the other hand, the column A/D circuit 25 is driven by the clock CK0 having the same frequency as the reference frequency. Since the column A/D circuit 25 is driven by the clock CK0 that has the highest frequency among the internal clocks, the power consumption of the column A/D circuit 25 alone is relatively high. Furthermore, there are a large number of column A/D circuits 25, since the column A/D circuit 25 is provided in correspondence with each column of the pixel array 10. Consequently, the power consumption of the column A/D circuit 25 alone has a large impact on the power consumption of the image sensor as a whole.

SUMMARY OF THE INVENTION

The object of the present invention is therefore to provide a solid-state imaging device and a camera that can change gain when necessary, and reduce power consumption more than those of conventional techniques.

The above object is fulfilled by a solid-state imaging device comprising: a pixel array in which a plurality of pixels are arranged in rows and columns; a reference signal generation unit operable to generate a reference signal for each of horizontal periods, the reference signal changing monotonically for a predetermined period included in each of the horizontal periods; comparators that are arranged in one-to-one correspondence with the columns of the pixel array, each of the comparators being operable to compare, for each pixel in a corresponding column, (i) a level of a pixel signal output from a pixel in the corresponding column with (ii) a level of the reference signal; a counter operable to count input clock pulses; a clock control unit operable to generate a clock that is to be input into the counter, and change frequency of the clock based on external input data; and memories that are arranged in one-to-one correspondence with the columns of the pixel array, each of the memories being operable to store, for each horizontal period, a digital value of the level of the pixel signal, the digital value being a difference between (i) a count value indicated by the counter at a start of the predetermined period and (ii) a count value indicated by the counter when a comparator of a corresponding column shows coincidence between the level of the pixel signal and the level of the reference signal.

A camera according to the present invention includes the above-described solid-state imaging device.

Here, the "external" in the above "external input data" means that the data has been input from outside the clock control unit, and does not mean outside the solid-state imaging device. Also, the above-described "changing monotonically for a predetermined period" is intended to include both "monotonic increase" and "monotonic decrease".

According to the stated structure, the frequency of the clock that is input into the counter is appropriately changed. When the frequency of the clock is changed, a count value indicated by the counter is different although the level of a pixel signal is the same. This makes it possible to change gain. Also, there is a case where the frequency of the clock that is input into the counter is decreased, depending on the gain that is desired. In this case, it is possible to reduce the power consumption of the comparator and the counter that are included in the column A/D circuit. Since the number of column A/D circuits is large, it is possible to considerably reduce the power consumption of the solid-state imaging device as a whole by reducing the power consumption of the column A/D circuit alone.

Also, the external input data may indicate a brightness of a scene derived from a level of each of the pixel signals that have been output from the pixels; and the clock control unit may change the frequency of the clock in accordance with the brightness of the scene. This makes it possible to set the most appropriate clock frequency in accordance with the brightness of a scene.

Furthermore, the clock control unit may change the frequency of the clock in a manner that the brighter the brightness of the scene is, the lower the frequency of the clock is. In this way, when the scene is bright, namely the level of a pixel signal is high, the power consumption is reduced while minimizing image degradation caused by a decrease in the bit precision. Also, when the scene is dark, namely the level of the pixel signal is low, image quality can be improved by increasing the bit precision.

The clock control unit may be further operable to change a length of a period for inputting the clock into the counter, and change the period in a manner that the higher the frequency of the clock is, the shorter the period is. This improves a frame rate.

Also, the reference signal generation unit may change a rate of the temporal change of the reference signal, in accordance with the brightness of the scene. This makes it possible to set the most appropriate rate of change of the reference signal, in accordance with the brightness of a scene. For example, it is possible to roughly adjust the input range and the bit precision of an analog-digital conversion circuit that is composed of a comparator, a counter, and a memory, by setting the frequency of the clock that is to be input into the counter. It is also possible to finely adjust the input range and the bit precision that have been roughly adjusted, by setting the rate of change of the reference signal.

Furthermore, the reference signal generation unit may change the rate of the temporal change of the reference signal, in a manner that the brighter the brightness of the scene is, the higher the rate of the temporal change of the reference signal is. This makes it possible to reduce gain when the level of a pixel signal is high.

Also, each of the plurality of pixels may include an amplification unit for amplifying a signal level, and the solid-state imaging device may further comprise a current suppression unit operable to one of suppress and stop current flowing in either the amplification units or the comparators, from elapse of the period for inputting the clock into the counter to arrival of a next period for inputting the clock into the counter. This further reduces power consumption.

Furthermore, the solid-state imaging device may further comprise a current suppression unit operable to suppress current flowing in the comparator when the frequency of the clock is lower than a predetermined value. This even further reduces power consumption.

Also, the external input data may indicate a readout mode of the pixel signal, and the clock control unit may change the frequency of the clock in accordance with the readout mode. This makes it possible to set the most appropriate clock frequency in accordance with the readout mode.

Furthermore, the clock control unit may set the frequency of the clock to (i) a first frequency in a mode where the pixel signal is read as a still image, and (ii) a second frequency that is lower than the first frequency in a mode where the pixel signal is read as a moving image. This realizes the most appropriate drive mode, in which emphasis is placed on (i) image quality in the mode where the pixel signal is read as a still image, and (ii) the reduction of power consumption in the mode where the pixel signal is read as a moving image.

Also, the clock control unit may change the frequency of the generated clock by a unit of frame to be captured. This makes it possible to set gain by the unit of frame.

Furthermore, the reference signal generation unit may generate the reference signal in synchronization with a reference clock having a predetermined frequency, so that the reference signal changes in stages over time, and the clock control unit may generate the clock by dividing the predetermined frequency of the reference clock by m (m being an integer), so that the clock has a desired frequency. This makes it possible to easily obtain the clock having the desired frequency.

BRIEF DESCRIPTION OF THE DRAWINGS

These and the other objects, advantages and features of the invention will become apparent from the following description thereof taken in conjunction with the accompanying drawings which illustrate specific embodiments of the present invention. In the drawings.

DESCRIPTION OF THE PREFERRED EMBODIMENTS

The following describes in detail the preferred embodiments for carrying out the present invention, with reference to the attached drawings.

(First Embodiment)

Figure 1:
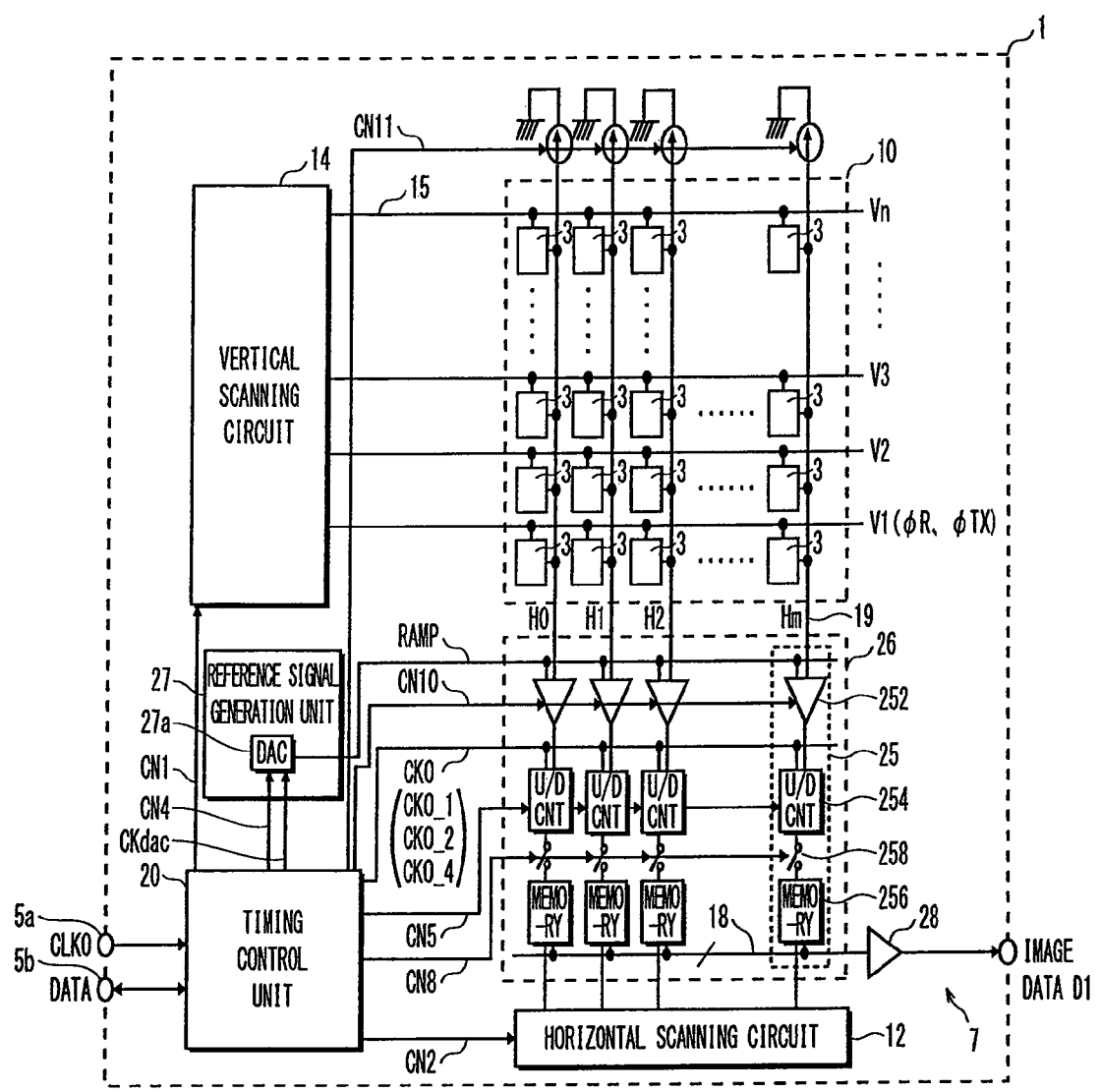
FIG. 1 is a schematic construction diagram showing an image sensor according to a first embodiment of the present invention.

FIG. 1 is a schematic construction diagram showing an image sensor according to a first embodiment of the present invention.

Figure 17:
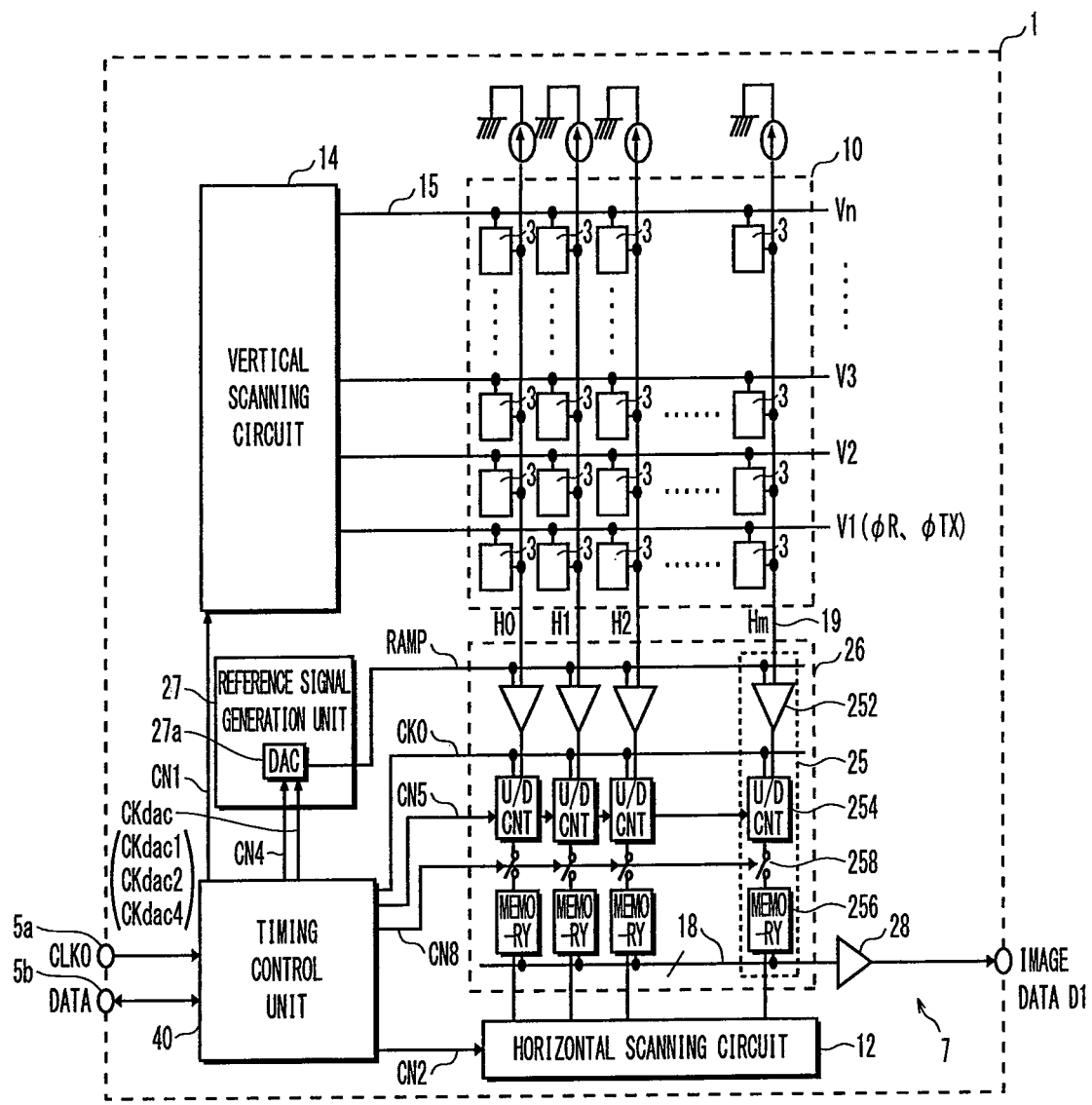
FIG. 17 is a schematic construction diagram of an image sensor shown in a conventional technique 2.

The difference between an image sensor according to the first embodiment of the present invention and an image sensor according to a conventional technique (shown in FIG. 17) is mainly the construction of a timing control unit. This causes a difference in (i) a clock CKdac that is input into a reference signal generation unit 27 and (ii) a clock CK0 that is input into a column A/D circuit 25. In other words, a timing control unit 20 according to the first embodiment fixes the frequency of the clock CKdac based on which reference signals are generated, and changes the frequency of a clock CK0 when necessary (CK0_1, CK0_2, CK0_4), where counts are made based on the clock CK0. In contrast, a timing control unit 40 according to a conventional technique (conventional technique 2) changes the frequency of the clock CKdac when necessary (CKdac 1, CKdac 2, CKdac 4), and fixes the frequency of the clock CK0 based on which counts are made, where reference signals are made based on the clock CKdac.

The timing control unit 20 generates various internal clocks (clock CKdac, CK0 and such), based on a master clock CLK0 input from outside via a terminal 5a. Also, the timing control unit 20 sets the frequency of the clock CK0 based on data that has been input from outside via a terminal 5b.

Note that a camera according to the first embodiment of the present invention includes a signal processing unit that performs a signal process on image data D1, a memory that stores image data obtained by the signal process, a control unit that determines gain, an optical system for forming an image in the image sensor and such, in addition to the above-described image sensor.

The following describes the operation of the image sensor according to the first embodiment of the present invention, particularly the operation when an pixel signal is A/D converted by the column circuit 25.

Figure 2:
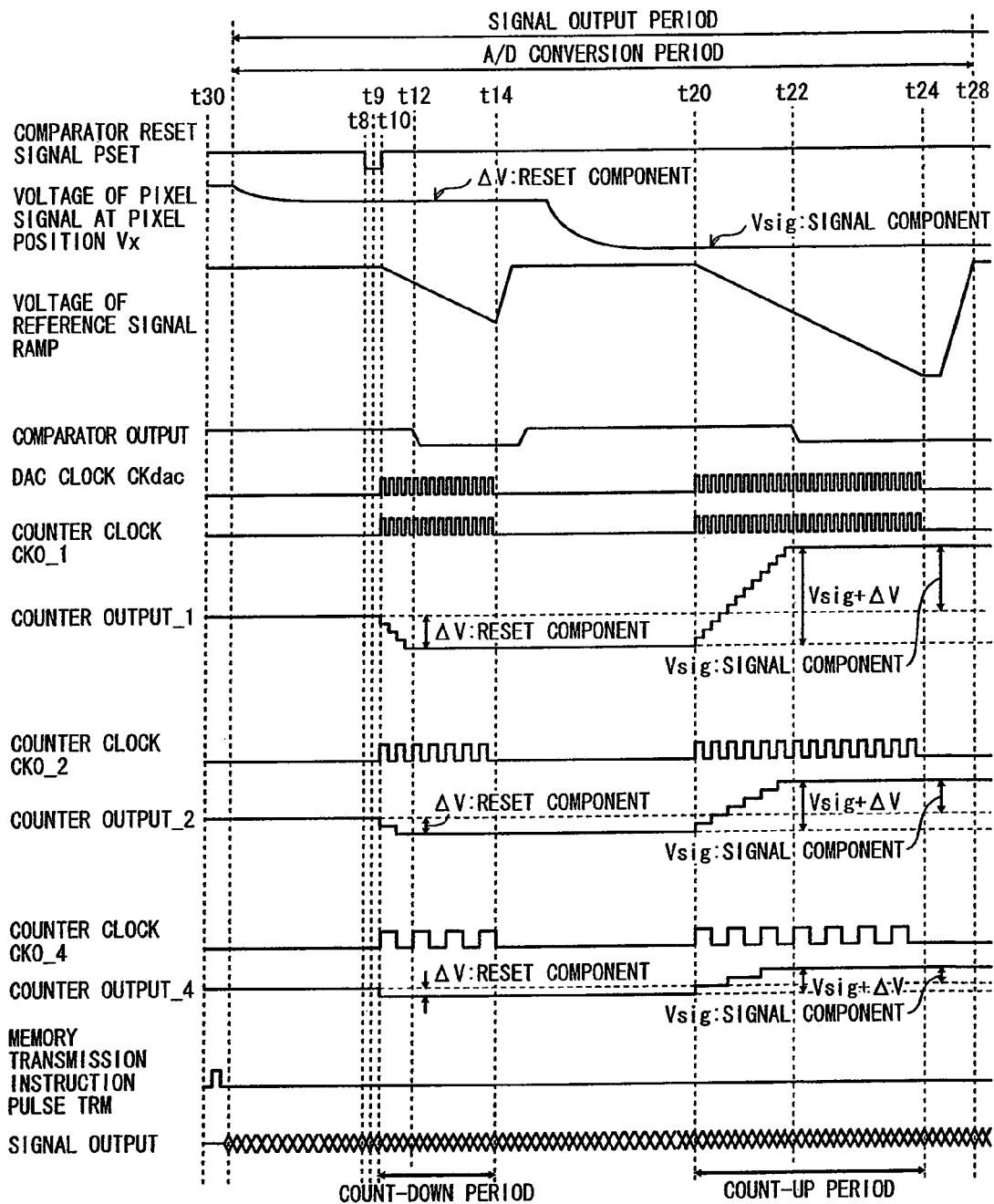
FIG. 2 is a timing chart showing the operation of the image sensor according to the first embodiment of the present invention.

FIG. 2 is a timing chart showing the operation of the image sensor according to the first embodiment of the present invention.

Figure 16:
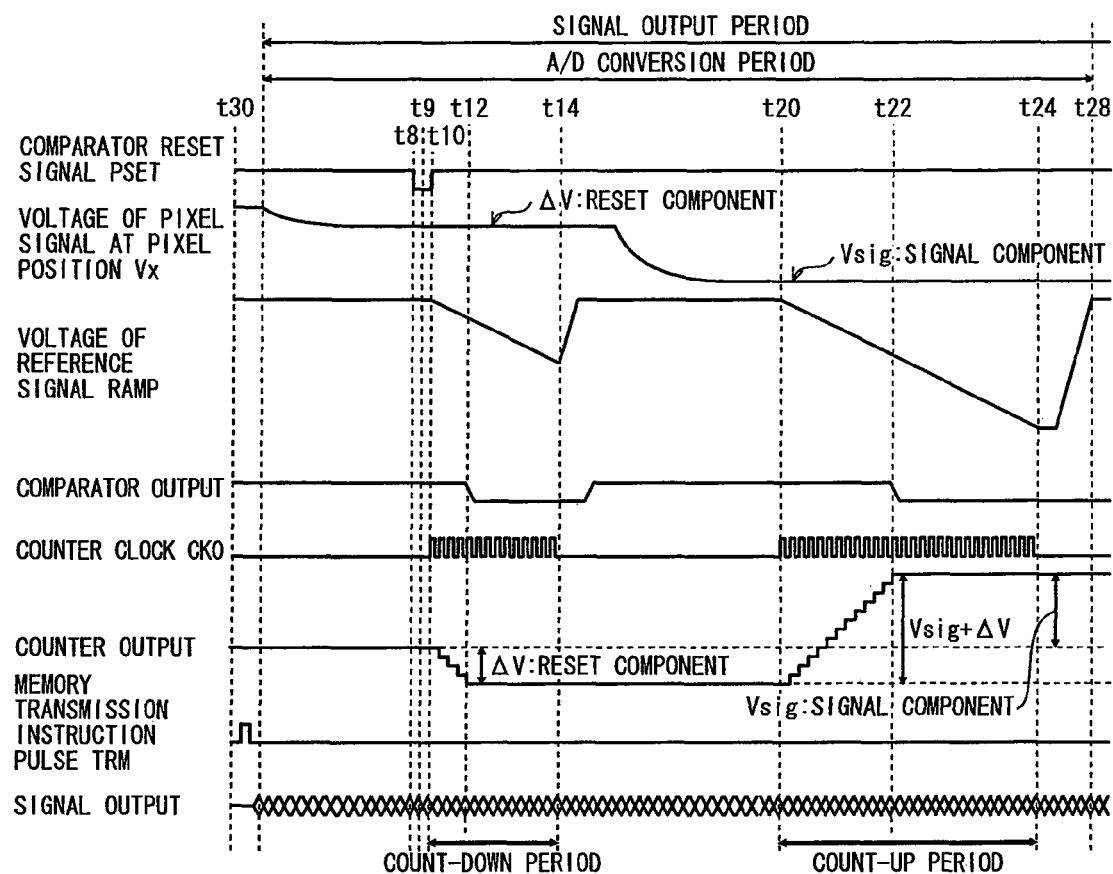
FIG. 16 is a timing chart showing the operation of the image sensor according to a conventional technique 1.

Here, the specifications of the image sensor according to the first embodiment are made the same as those of the image sensor according to the conventional technique (see FIG. 16), except for the characteristic part, so that it is easy to compare the first embodiment of the present invention and the conventional technique.

The clock CKdac is input into the reference signal generation unit 27. The clock CKdac has the same frequency as the master clock CLK0 input from outside.

One of a clock CK0_1, a clock CK0_2, and a clock CK0_4 is selectively input into the column A/D circuit 25. The clock CK0_1 has the same frequency as the master clock CLK0, the clock CK0_2 has ½ of the frequency of the master clock CLK0, and the clock CK0_4 has ¼ of the frequency of the master clock CLK0. In other words, a clock CK0_m is obtained by dividing the master clock CLK0 by m (m is an integer).

When the clock CK0_m is input into the column A/D circuit 25, the number of counts counted by the counter 254 is 1/m compared to the number of counts thereof when the clock CK0_1 is input thereinto, although the level of a pixel signal is the same. The number of counts counted by the counter 254 being 1/m is equivalent to the gain being 1/m, and also equivalent to the bit precision being as low as m times. In this way, the gain can be appropriately changed by appropriately changing the frequency of the clock that is to be input into the column A/D circuit 25.

Also, the lower the frequency of the clock CK0 that is input is, the more effectively the column A/D circuit 25 suppresses (i) a current necessary for the comparison operation of a comparator 252 and (ii) a current necessary for the count operation of the counter 254, thereby reducing power consumption. Accordingly, the power consumption of the column A/D circuit 25 can be reduced depending on the gain desired.

Figure 3:
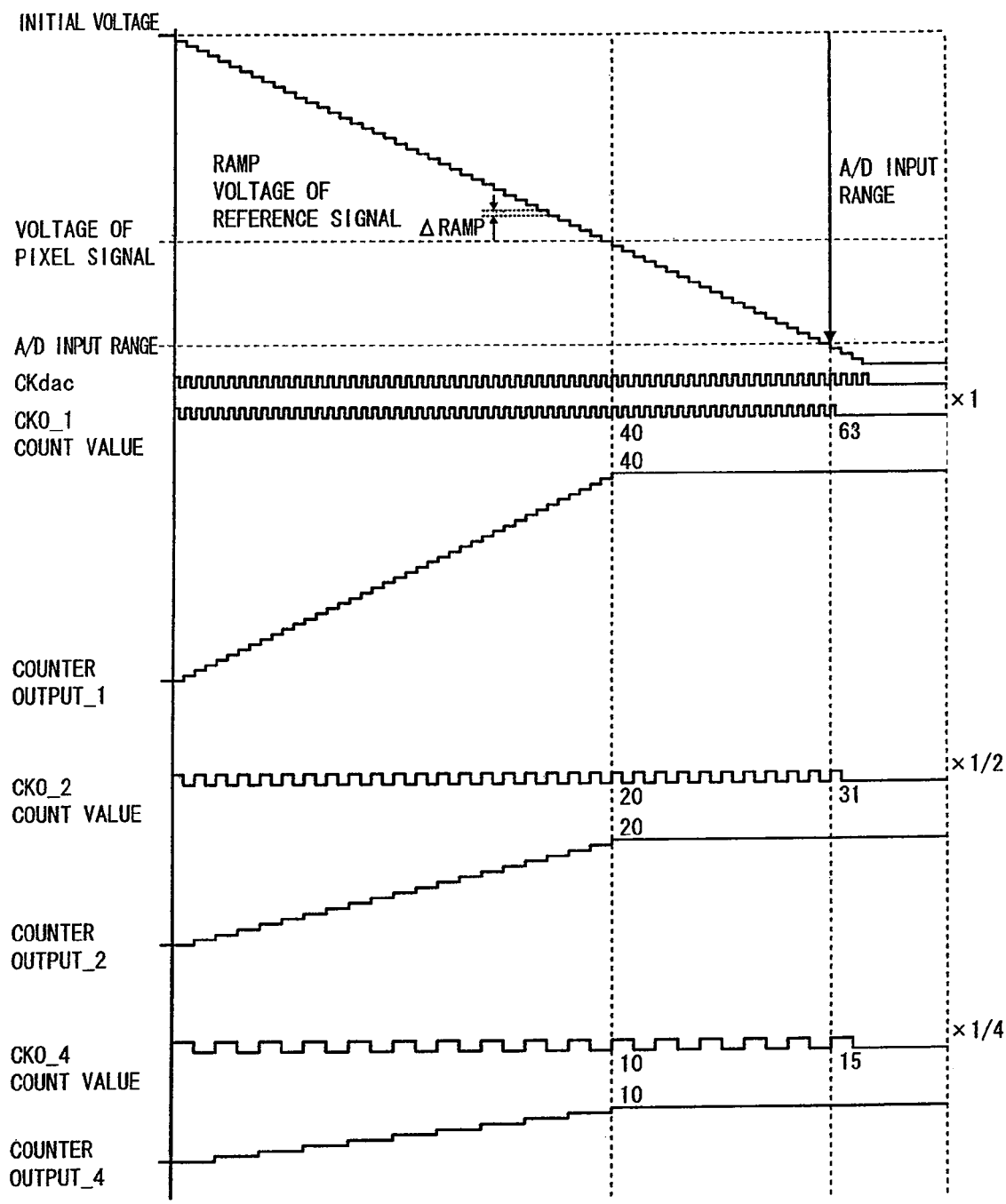
FIG. 3 is a timing chart showing in detail a relationship between a counter output and a clock CK0 that is input into a column A/D circuit.

FIG. 3 is a timing chart showing in detail a relationship between a counter output and the clock CK0 that is input into the column A/D circuit.

When the clock CK0_1 is input into the column A/D circuit 25, a counter output 1 with respect to the level of a certain pixel signal indicates "40". In this example, the clock CK0_1 is set to count from 0 to 63. Therefore, the pixel signal has "6 bits", and the bit precision is A/64 [V/LSB] when the A/D input range is A[V].

When the clock CK0_2 is input into the column A/D circuit 25, a counter output 2 with respect to the level of a certain pixel signal indicates "20". This is because the frequency of the clock CK0_2 is ½ the frequency of the clock CK0_1, resulting in the slope of the counter output 2 being ½ the slope of the counter output 1. In this example, the clock CK0_2 is set to count from 0 to 31. Therefore, the pixel signal has "5 bits", and the bit precision is A/32 [V/LSB] when the A/D input range is A[V].

When the clock CK0_4 is input into the column A/D circuit 25, a counter output 4 with respect to the level of a certain pixel signal indicates "10". This is because the frequency of the clock CK0_4 is ¼ the frequency of the clock CK0_1, resulting in the slope of the counter output 4 being ¼ the slope of the counter output 1. In this example, the clock CK0_4 is set to count from 0 to 15. Therefore, the pixel signal has "4 bits", and the bit precision is A/16 [V/LSB] when the A/D input range is A [V].

The following describes an application example of the image sensor according to the first embodiment of the present invention.

Figure 4:
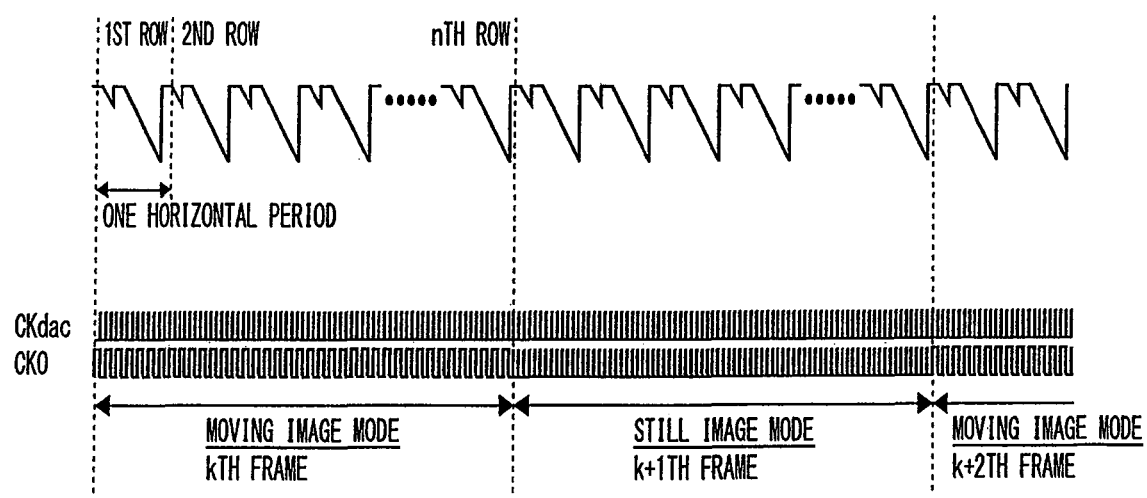
FIG. 4 is an application example of the image sensor according to the first embodiment of the present invention, and shows an operation example of when an image-capturing mode is switched between a moving image mode and a still image mode.
Figure 5:
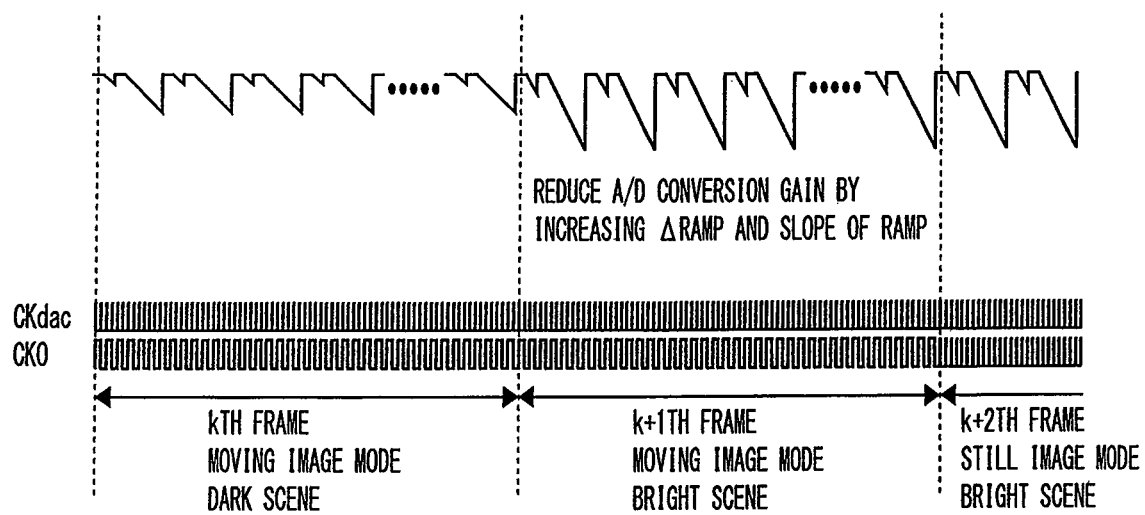
FIG. 5 is an application example of the image sensor according to the first embodiment of the present invention, and shows an operation example of when the brightness of a scene changes.

FIG. 4 shows an operation example of when an image-capturing mode is switched between a moving image mode and a still image mode, and FIG. 5 shows an operation example of when the scene brightness changes. FIGS. 4 and 5 respectively show the $k+1^{th}$ to $k+2^{th}$ frames. Each of the frames includes n horizontal periods.

As shown in FIG. 4, an image is captured in the moving image mode in the $k^{th}$ frame, and the frequency of the clock CK0 is set to be lower than the frequency of the clock CKdac. An image is captured in the still image mode in the $k+1^{th}$ frame, and the frequency of the clock CK0 is set to be the same as the frequency of the clock CKdac. An image is captured in the moving image mode in the $k+2^{th}$ frame, and the frequency of the clock CK0 is set to be lower than the frequency of the clock CKdac.

As described above, the frequency of the clock CK0 is set to be lower than the frequency of the clock CKdac in the moving image mode, so as to reduce power consumption. Also, the frequency of the clock CK0 is set to be the same as the frequency of the clock CKdac in the still image mode, so as to improve image quality. In the moving image mode, it is important to reduce power consumption as much as possible, in order to drive the image sensor at all times. In contrast, image quality is more important in the still image mode, since images are often developed and reprinted as pictures. The above-described application example makes it possible to provide an image sensor that satisfies such needs.

As shown in FIG. 5, a dark scene is captured in the moving image mode in the $k^{th}$ frame. In this case, the frequency of the clock CK0 is set to be lower than the frequency of the clock CKdac, and the amount of change Δ RAMP of a reference signal per clock is set to be small. Further, in the $k+1^{th}$ frame, a bright scene is captured in the moving image mode. In this case, the frequency of the clock CK0 is set to be lower than the frequency of the clock CKdac, and the amount of change Δ RAMP of the reference signal per clock is set to be large. As in the $k+2^{th}$ frame, a bright scene is captured in the still image mode. In this case, the frequency of the clock CK0 is set to be the same as the frequency of the clock CKdac, and the amount of change Δ RAMP of the reference signal per clock is set to be large.

As described above, when a dark scene is to be captured, the amount of change Δ RAMP of the reference signal per clock is reduced so that the number of counts counted by the counter 254 can be made larger, even though the pixel signals are at the same level, and the gain can be increased. Meanwhile, when a bright scene is to be captured, the amount of change Δ RAMP of the reference signal per clock is increased so that the A/D input range can be made larger.

Note that the amount of change Δ RAMP of the reference signal per clock can be arbitrarily adjusted by the reference signal generation unit 27, based on control data CN4 input from the timing control unit 20. For example, the above specifications can be realized if the reference signal generation unit 27 is for outputting a voltage y that is calculated using the equation $y = \alpha$ (initial voltage) $- \beta \times x$, based on (i) a count value x that is a count value of the counter CKdac and (ii) data β that is data pertaining to the slope of the reference signal and that is included in the control data CN4.

Second Embodiment

The following describes the operation of an image sensor according to a second embodiment of the present invention, particularly the operation when an pixel signal is A/D converted by the column A/D circuit 25. Note that the description of a schematic construction of the image sensor is omitted, since the construction is the same as that shown in FIG. 1.

Figure 6:
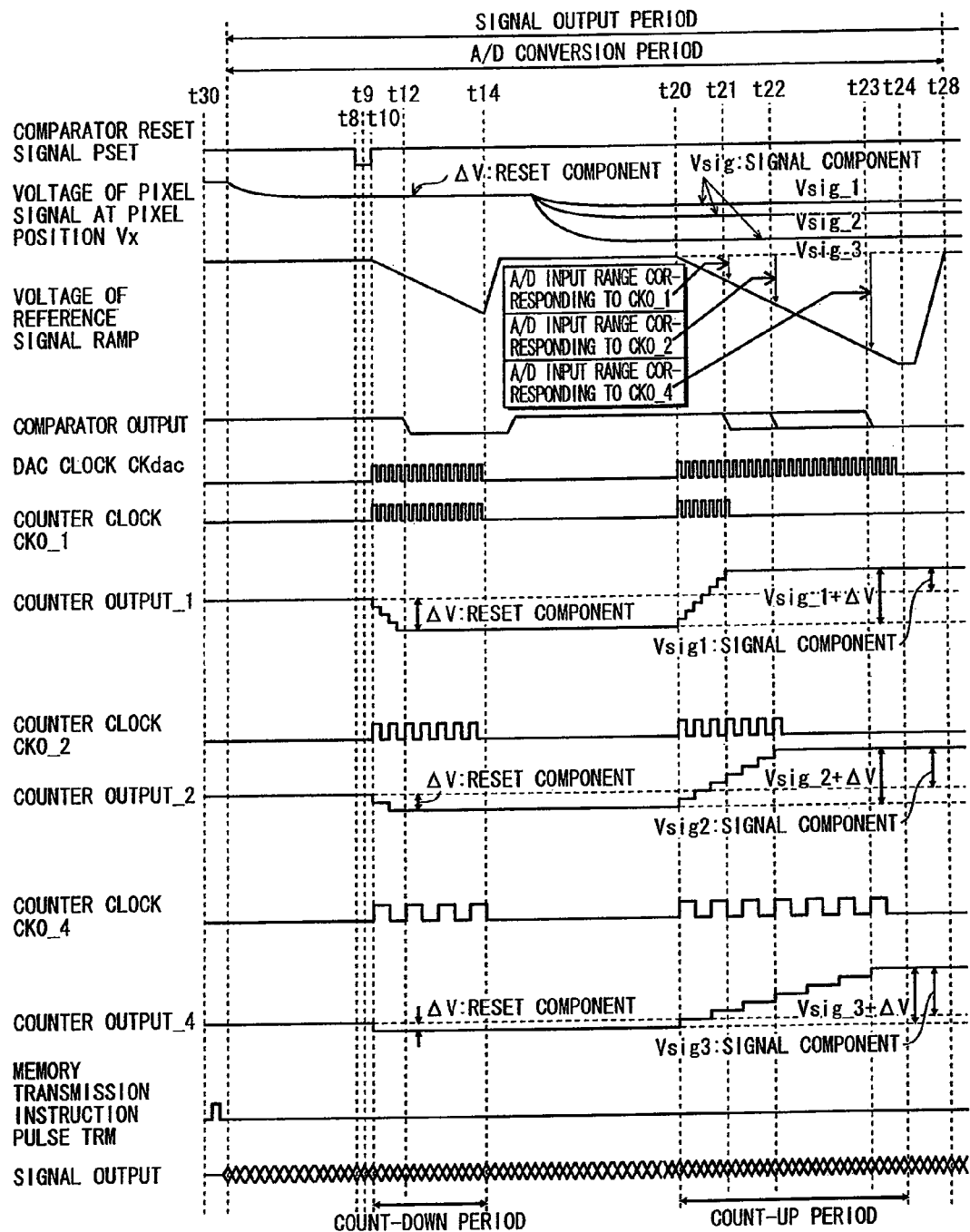
FIG. 6 is a timing chart showing the operation of an image sensor according to a second embodiment of the present invention.

FIG. 6 is a timing chart showing the operation of the image sensor according to the second embodiment of the present invention.

The second embodiment is the same as the first embodiment in that (i) the clock CKdac is input into the reference signal generation unit 27 and (ii) one of the clock CK0_1, the clock CK0_2, and the clock CK0_4 is selectively input into the column A/D circuit 25.

However, an upper limit of the number of counts, for each of the clock CK0_1, the clock CK0_2, and the clock CK0_4, is fixed in the second embodiment, which is different from the first embodiment. In other words, the higher the frequency of the clock CK0 is, the shorter a period for inputting the clock CK0 (count-up period) is. As a result, a period for A/D conversion becomes shorter.

Figure 7:
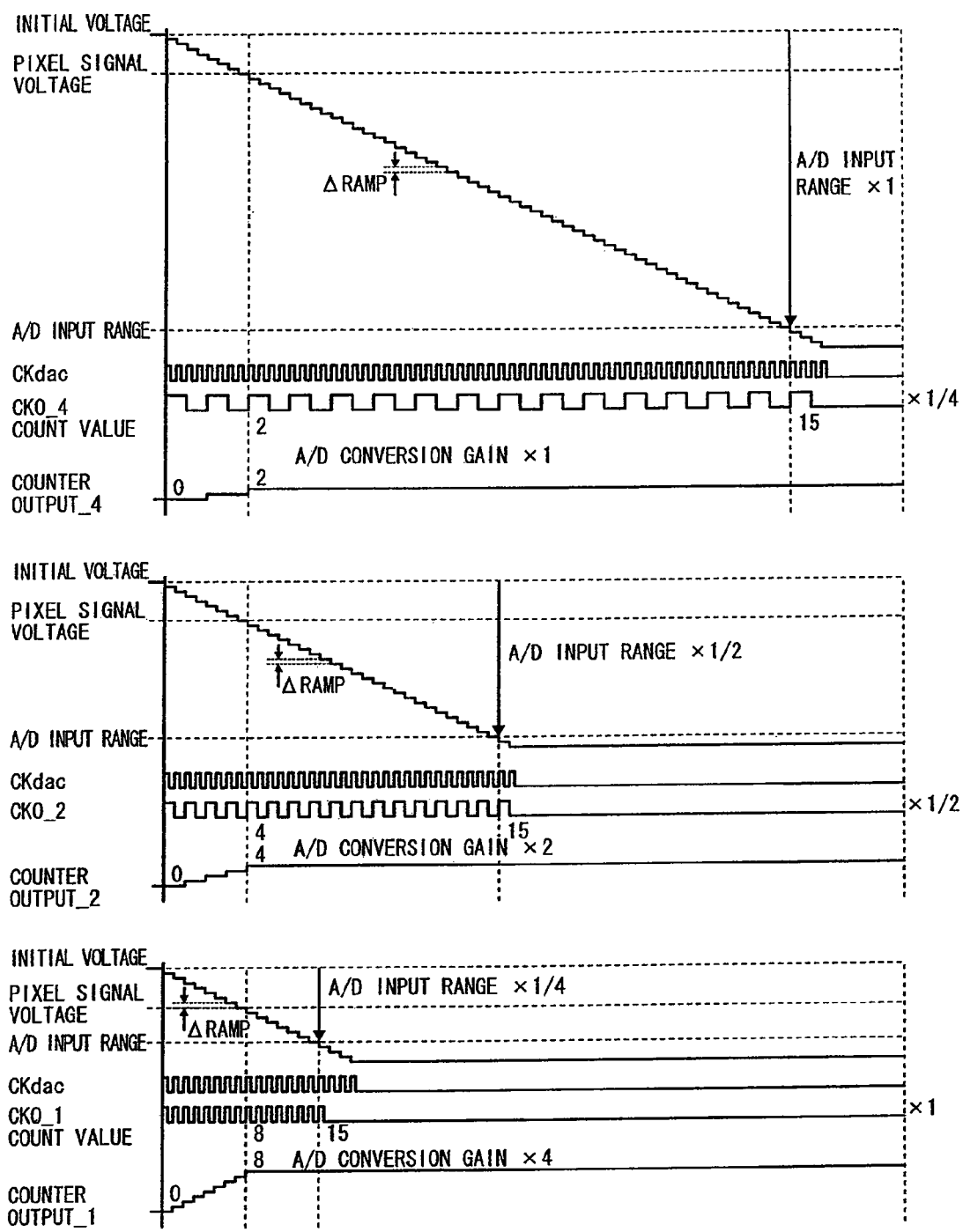
FIG. 7 is a timing chart showing in detail a relationship between the counter output and the clock CK0 that is input into the column A/D circuit.

FIG. 7 is a timing chart showing in detail a relationship between the counter output and the clock CK0 that is input into the column A/D circuit.

Here, an upper limit of the number of counts for the clock CK0_1, the clock CK0_2, and the clock CK0_4 is "15".

When the clockCK0_4 is input into the column A/D circuit 25, the counter output 4 with respect to the level of a certain pixel signal indicates "2".

When the clockCK0_2 is input into the column A/D circuit 25, the counter output 2 with respect to the level of a certain pixel signal indicates "4".

When the clockCK0_1 is input into the column A/D circuit 25, the counter output 1 with respect to the level of a certain pixel signal indicates "8".

As described above, when the frequency of a clock is multiplied by k, the slope of counter output is also multiplied by k, which makes it possible to multiply the gain by k. Meanwhile, an upper limit of the number of counts of the clock is fixed, resulting in the A/D input range being 1/k.

The following describes an application example of the image sensor according to the second embodiment of the present invention. In particular, it is possible to appropriately set the gain and the A/D input range, according to the brightness of a scene.

In a bright scene, it is necessary to widen the A/D input range, since a signal component Vsig of a pixel signal is large. In this case, the A/D input range can be widen, for example, by inputting the clock CK0_4 into the column A/D circuit.

In a dark scene, however, the signal component Vsig of the pixel signal is small. Therefore, it is more important to increase the gain rather than widen the A/D input range. In this case, the gain can be increased by inputting the clock CK0_1 into the column A/D circuit.

The bit precision of A/D conversion is A/n [V/LSB] when the A/D input range is A[V] and the number of bits is n [LSB]. The smaller the value is, the higher the bit precision is. When a clock to be input is changed from the clock CK0_4 to the clock CK0_1, the A/D input range A becomes ¼ and the bit precision also becomes ¼. This means that the bit precision becomes as high as 4 times. In other words, the bit precision is improved k-fold when the frequency of the clock CK0 is multiplied by k (the setting of frequency division is multiplied by k).

It is particularly important for image sensors to suppress noise N in dark scenes, and therefore the effect of the second embodiment is significant. This is because of the following reasons. First, when N is fixed, S becomes small in dark scenes, and S/N becomes large, indicating quality degradation. Second, because the optical shot noise increases with the square root of S ($\sqrt{S}$), S becomes large in a bright scene and the optical shot noise becomes dominant, resulting in the effect of a noise in a lower bit of A/D being small. Meanwhile, when S is small in a dark scene, the absolute value of the optical shot noise becomes small. As a result, the effect of noise N that occurs in a circuit for reading pixel signals, such as an A/D conversion circuit, becomes large. Therefore, it is necessary to improve the bit precision of the A/D conversion.

The frequency division setting k/m of the clock CK0 can be obtained as follows, when a required A/D input range is A, the number of bits of A/D conversion is n, and the amount of change of a reference signal per clock of the clock CKdac is Δ RAMP.

The A/D input range A can be expressed by Δ RAMP×(the number of clocks of the clock CKdac). The number of clocks of the clock CKdac is obtained by dividing the number of bits of A/D conversion n by the frequency division setting k/m of the clock CK0, and thus n/(k/m). In other words, the input range A of A/D conversion can be expressed by $$A = \Delta \text{RAMP} \times n/(k/m) \tag{1}$$

With the above equation, the frequency division setting k/m of the clock CK0 can be expressed by $$(k/m) = \Delta \text{RAMP} \times n/A \tag{2}$$

Also, with the equation (2), the bit precision A/n can be expressed by $$(A/n) = \Delta \text{RAMP}/(k/m) \tag{3}$$

It can be known from the equations (1) and (3) that, (i) the frequency division setting k/m of the counter clock CK0 may be set large (high) when a scene is dark, the accuracy of A/D conversion is required, and the A/D input range can be set low, and (ii) the frequency division setting k/m of the counter clock CK0 may be set small (low) when a scene is bright, the accuracy of A/D conversion is less required, and the A/D input range is set high.

Figure 18:
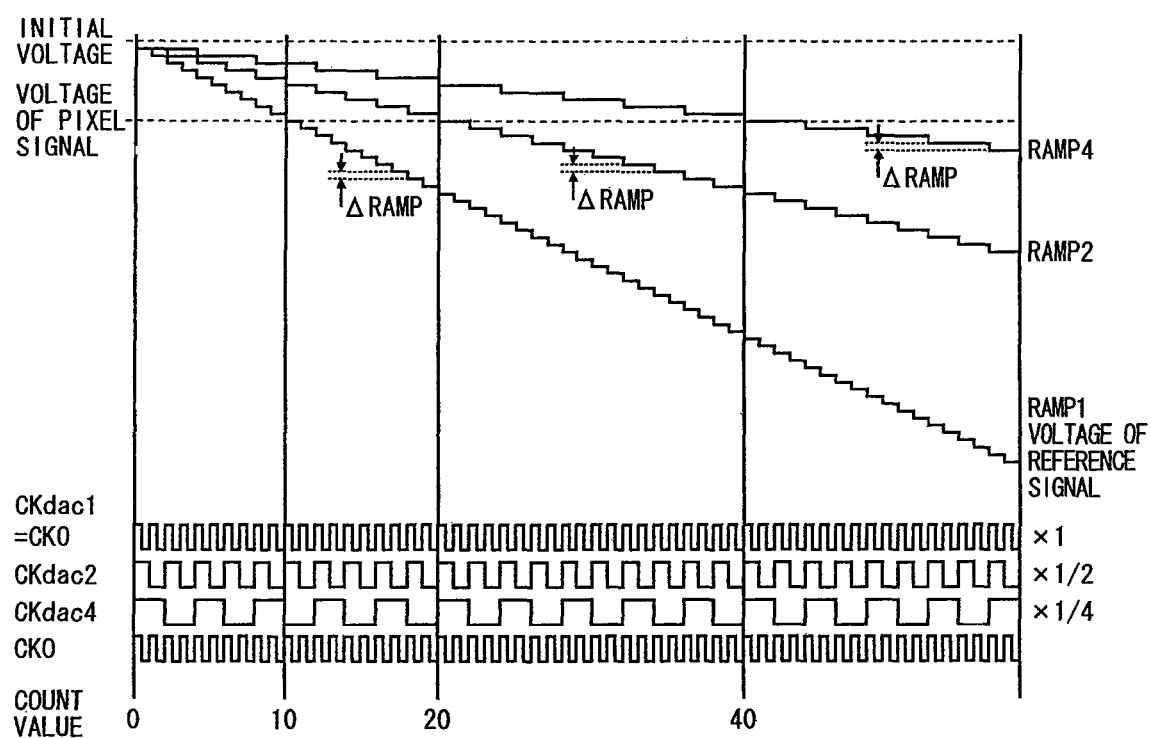
FIG. 18 shows in detail a reference signal RAMP and a clock in a conventional technique 2.

As can be seen when comparing FIG. 18 that shows a conventional technique and FIG. 7 that shows the second embodiment of the present invention, since the upper limit of the number of counts is fixed in the second embodiment, the number of bits of A/D conversion n can be set small by changing the frequency division setting of the clock CK0 according to a scene. The bit precision of A/D conversion is equivalent between (i) a case where the clock CK0_1 is set as shown in FIG. 7 and (ii) a case shown in FIG. 18, which is a conventional technique. In other words, with the image sensor according to the second embodiment, it is possible to obtain a high bit precision with a small number of bits of A/D conversion n. Also, it is possible to reduce the chip size and suppress power consumption by decreasing the number of bits of A/D conversion n.

Next, the description is provided of a method for arbitrarily adjusting the input range of A/D conversion and the bit precision, by setting Δ RAMP and the frequency division of the clock CK0.

As shown in equations (1) and (3), it is necessary to set the frequency division setting (k/m) in detail, in order to set the input range of A/D conversion and the bit precision in detail. However, there is a limit in setting the frequency division setting (k/m) in detail. In this case, the frequency division setting of the clock CK0 can be combined with the rate of a voltage change Δ RAMP, so that it is possible to set a large input dynamic range of the A/D conversion and the bit precision in detail.

Figure 8:
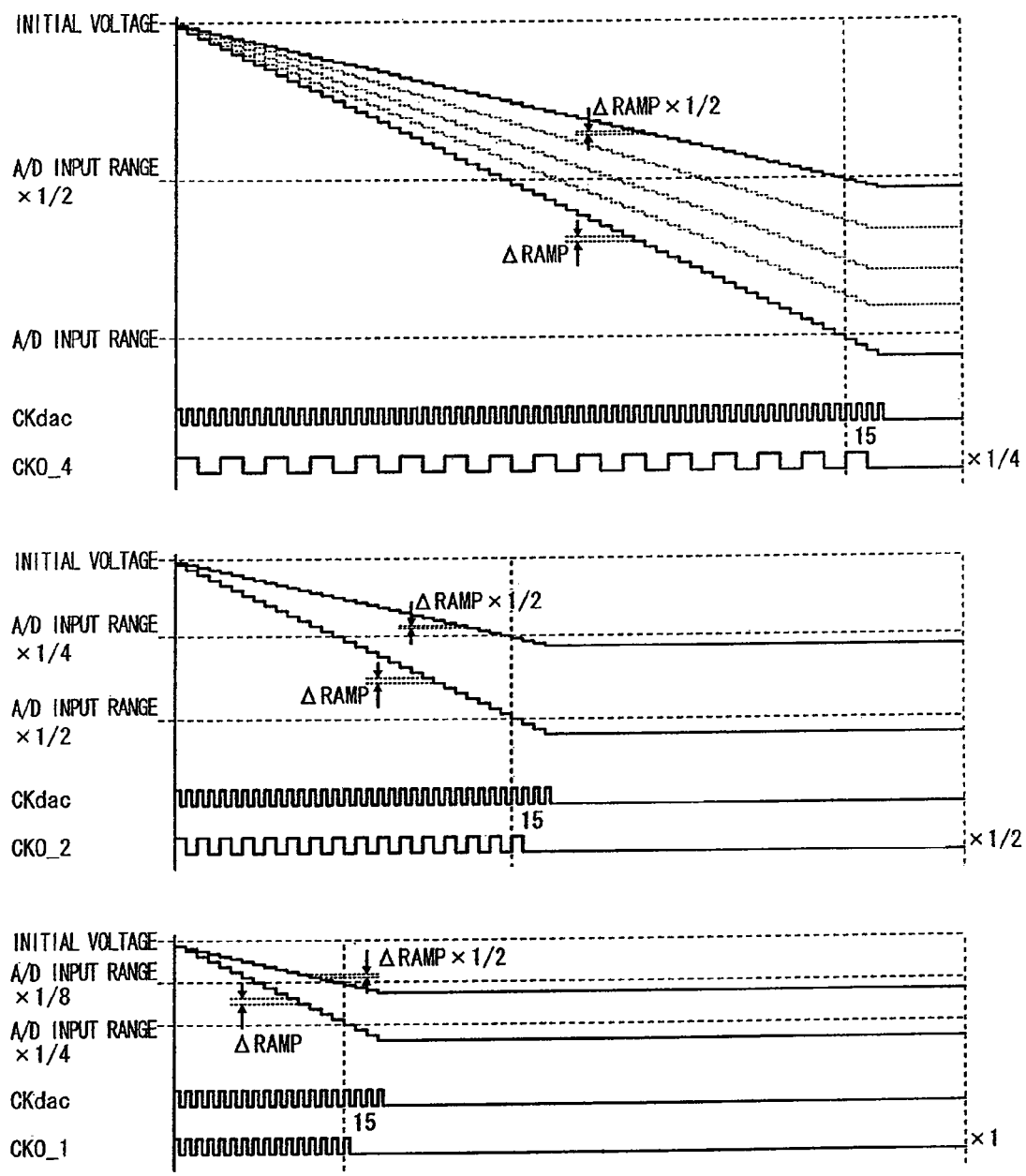
FIG. 8 shows one example of the combination of a frequency division setting of the clock CK0 and the amount of change Δ RAMP of a reference signal per clock.

FIG. 8 shows one example of the combination of the frequency division setting of the clock CK0 and the amount of change Δ RAMP of a reference signal per clock.

Assume here that the frequency division setting is changed in order of ¼-fold, ½-fold, and 1-fold. In this case, the bit precision of A/D conversion changes in order of 1-fold, 2-fold, and 4-fold, whereas the A/D input range changes in order of 1-fold, ½-fold, and ¼-fold. FIG. 8 shows a method for arbitrarily setting in detail (i) the bit precision and (ii) the input dynamic range, among 1-fold, 2-fold and 4-fold, by varying the amount of change Δ RAMP.

As shown in FIG. 8, in a case where the clock CK0_4 is input and the amount of change Δ RAMP is set in detail in a range of 1-fold to ½-fold inclusive, (i) the AD input range is set in detail in a range of 1-fold to ½-fold inclusive, and (ii) the A/D bit precision is set in detail in a range of 1-fold to 2-fold inclusive.

Also, in a case where the clock CK0_2 is input, if the amount of change Δ RAMP is set in detail in a range of 1-fold to ½-fold inclusive, the AD input range is set in detail in a range of ½-fold to ¼-fold inclusive, and the A/D bit precision is set in detail in a range of 2-fold to 4-fold inclusive.

Furthermore, in a case where the clock CK0_1 is input, if the amount of change Δ RAMP is set in detail in a range of 1-fold to ½-fold inclusive, the AD input range is set in detail in a range of ¼-fold to ⅛-fold inclusive, and the A/D bit precision is set in detail in a range of 4-fold to 8-fold inclusive.

As described above, a combination of the setting of the frequency division of the clock CK0 and the setting of the amount of a voltage change Δ RAMP makes it possible to (i) set in detail the input range of A/D conversion in a range of 1-fold to ⅛-fold inclusive, and (ii) set in detail the bit precision of A/D conversion in a range of 1-fold to 8-fold inclusive.

Figure 9:
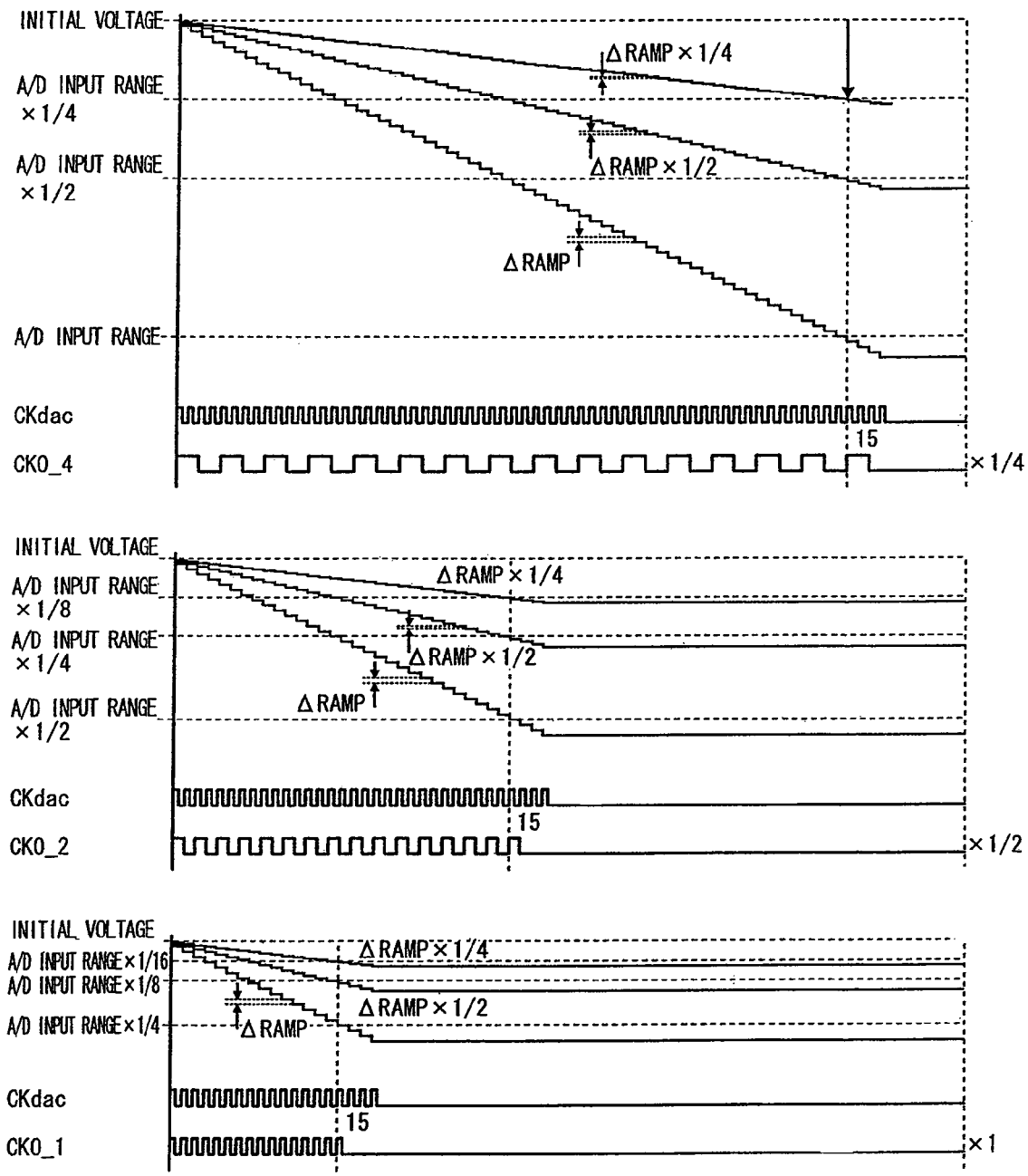
FIG. 9 shows one example of the combination of the frequency division setting of the clock CK0 and the amount of change Δ RAMP of the reference signal per clock.

Note that in the example shown in FIG. 8, the amount of change Δ RAMP is set in a range of 1-fold to ½-fold inclusive. However, as shown in the example of FIG. 9, the amount of change Δ RAMP may be set in a range of 1-fold to ¼-fold inclusive. In this case, it is possible to set either the clockCK0_4 or the clock CK0_2 as the clock CK0, if the AD input range is in a range of ½ to ¼ inclusive. In the same manner, it is possible to set either the clockCK0_2 or the clock CK0_1 as the clock CK0, if the AD input range is in a range of ¼ to ⅛ inclusive. As described above, if a desired A/D input range can be realized with either setting of the frequency division, one of the settings may be selected in accordance with the transition of a scene.

Figure 10:
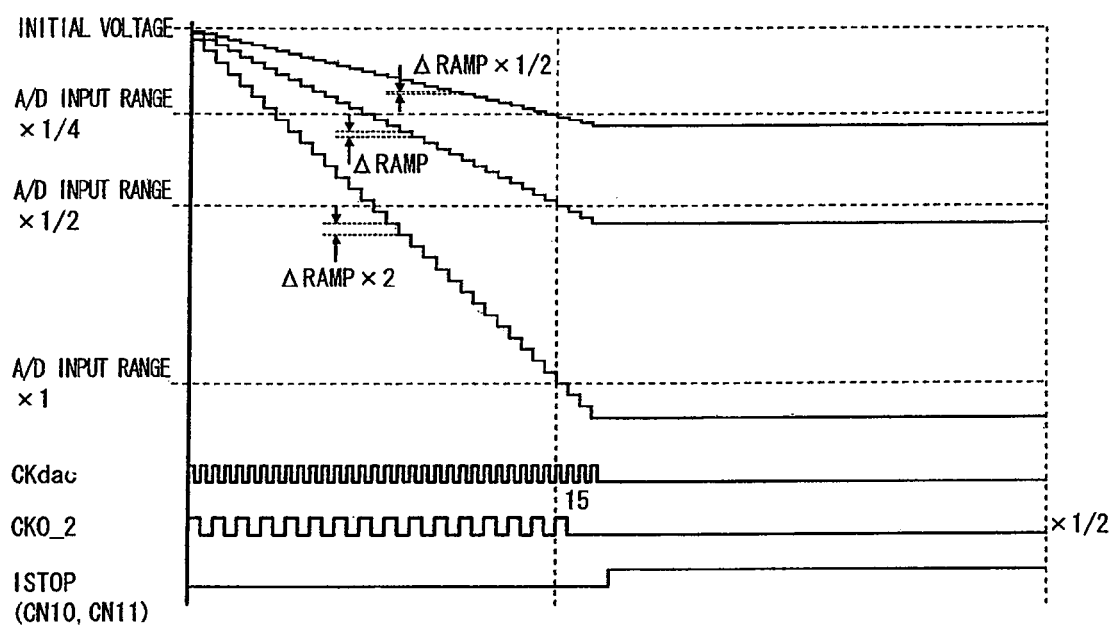
FIG. 10 shows a modification of the amount of change Δ RAMP of the reference signal per clock.

Also, as shown in the example of FIG. 10, the amount of change Δ RAMP may be set in a range of 2-fold to ½-fold inclusive. In a case where the amount of change Δ RAMP is set to 2-fold, (i) if the A/D conversion period is fixed, the A/D input range becomes 2-fold and, (ii) if the A/D input range is fixed, the A/D conversion period can be shortened by ½-fold. Also, as shown in FIG. 10, the current flowing in each circuit may be stopped by inputting an ISTOP signal into one of the comparator 252, the counter 254, and a circuit for amplifying a pixel signal, after the elapse of the A/D conversion period. This further improves the effect of reducing power consumption. In FIG. 1, a control signal CN10 that is input from the timing control unit 20 to the comparator 252 is for controlling the current flowing in the comparator 252. Also, a control signal CN11, which is input from the timing control unit 20 to a current source, is for controlling the current flowing in the current source. Control signal lines may be connected to one of the following switches: (i) a switch provided on a current path of an amplification unit, (ii) a switch for controlling a gate electrode of a current source circuit (load circuit) of the amplification unit, (iii) a switch for controlling a gate electrode of a current source bias circuit using a current mirror, and (iv) a switch for controlling a gate electrode of an amplification circuit of the amplification unit.

Figure 11:
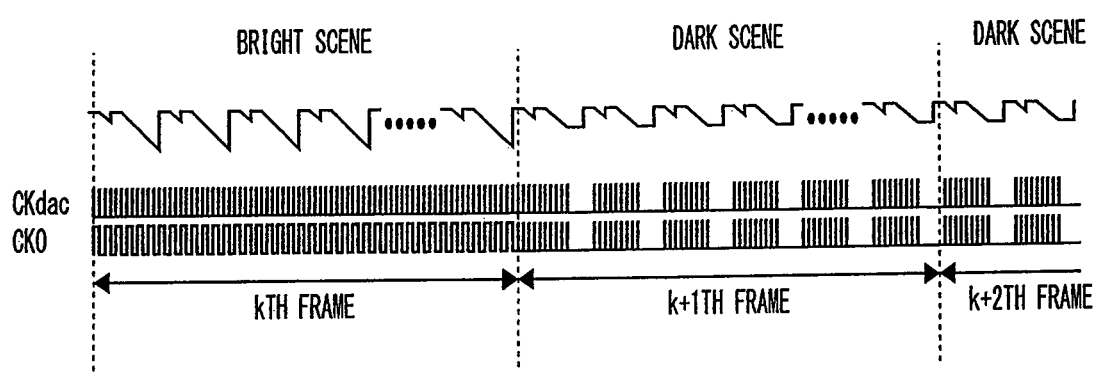
FIG. 11 is an application example of the image sensor according to the second embodiment of the present invention, and shows an operation example of when a scene changes from a bright scene to a dark scene.

The following describes an application example of the image sensor according to the second embodiment of the present invention. FIG. 11 shows an operation example of when a scene changes from a bright scene to a dark scene, and FIG. 12 shows an operation example of when a scene changes from a dark scene to a bright scene.

As shown in FIG. 11, a bright scene is captured in the $k^{th}$ frame. Since the signal component Vsig of a pixel signal is large in a bright scene, the frequency of the clock CK0 that is input into the column A/D circuit 25 is set low, and the A/D input range is set large. A dark scene is captured in the $k+1^{th}$ frame. Since the signal component Vsig of a pixel signal is small in a dark scene, the frequency of the clock CK0 that is input into the column A/D circuit 25 is set high, and the bit precision is set high. Also, the input of the clock CKdac and the clock CK0 is stopped during a period excluding the A/D conversion period.

Figure 12:
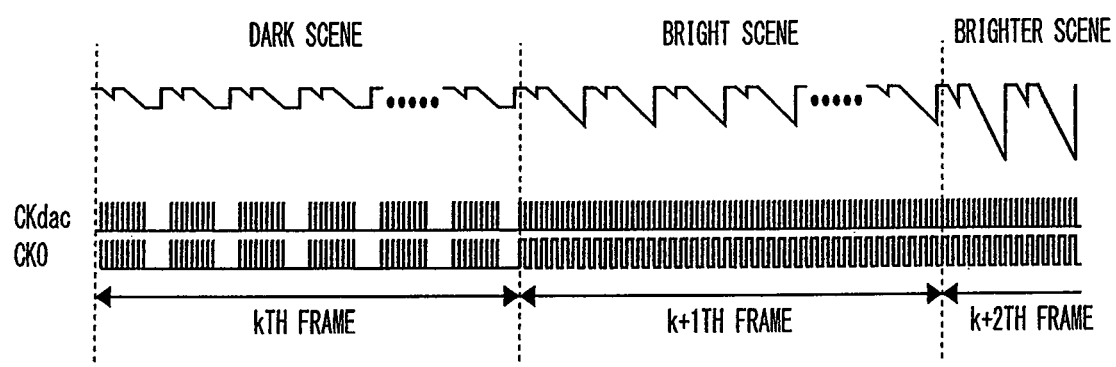
FIG. 12 an application example of the image sensor according to the second embodiment of the present invention, and shows an operation example of when a scene changes from a dark scene to a bright scene.

As shown in FIG. 12, a dark scene is captured in the $k^{th}$ frame. Since the signal component Vsig of a pixel signal is small in a dark scene, the frequency of the clock CK0 that is input into the column A/D circuit 25 is set high, and the bit precision is set high. A bright scene is captured in the $k+1^{th}$ frame. Since the signal component Vsig of a pixel signal is large in a bright scene, the frequency of the clock CK0 that is input into the column A/D circuit 25 is set low, and the A/D input range is set large. A further bright scene is captured in the $k+2^{th}$ frame. Here, the amount of a voltage change Δ RAMP of a reference signal is set large, so as to further increase the A/D input range.

As described above, in the image sensors according to the embodiments of the present invention and the driving methods thereof, it is possible to change the frequency division setting of the clock CK0. This makes it possible to set the most appropriate input range A and bit precision A/n in A/D conversion, according to a scene.

For example, when the bit precision of A/D conversion is required to be high, as seen in the still image mode or a dark scene, the frequency of the clock CK0 is increased. In this way, the bit precision of A/D conversion is increased, as shown in the equation (3). Also, as shown in the second embodiment, in a specification in which the upper limit of the number of counts of the clock CK0 is fixed, the A/D conversion period is shorten as a result of increasing the frequency of the clock CK0. Therefore, the power consumption can be further reduced, by either suppressing or stopping the current flowing in each circuit during the period excluding the A/D conversion period. Furthermore, it is possible to increase the bit precision while reducing the number of bits, by shortening the A/D conversion period and increasing the frequency of the clock CK0. This makes it possible to reduce the chip size and reduce the power consumption.

Also, when the input range of A/D conversion is required to be widen, as seen in the moving image mode or a bright scene, the frequency of the clock CK0 is decreased. In this way, it is possible to widen the input range of A/D conversion, as shown in the equation (1). Furthermore, it is possible to perform the count operation of the counter 254 and the comparison operation of the comparator 252 at low speed, by reducing the frequency of the clock CK0. As a result, power consumption can be reduced.

Also, it is possible to set the gain of A/D conversion in detail, by setting the amount of change Δ RAMP of the reference signal RAMP in addition to the setting of the frequency of the clock CK0. Note that the gain is roughly adjusted by the setting of the clock CK0, and finely adjusted by the setting of the amount of change Δ RAMP, as shown in the examples of FIGS. 8 to 10. However, the gain may be roughly adjusted by the setting of the amount of change Δ RAMP, and finely adjusted by the setting of the clock CK0.

Figure 13:
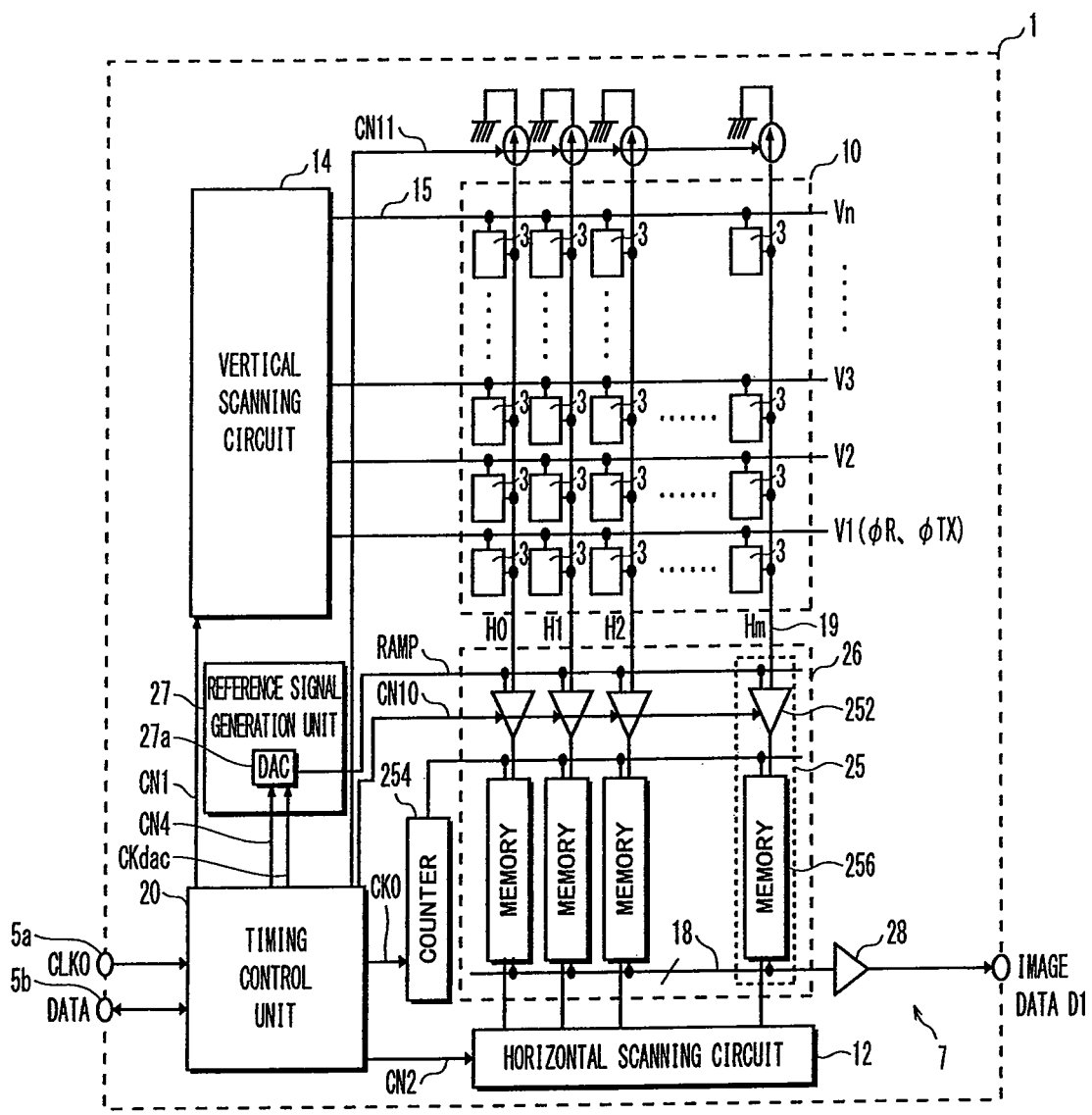
FIG. 13 is a schematic construction diagram showing an image sensor according to a modification of the present invention.

Note that the same effect as the present invention is obtained even with a circuit that only has one counter and stores the number of counts counted by the counter in a digital memory, as shown in FIG. 13.

Figure 14:
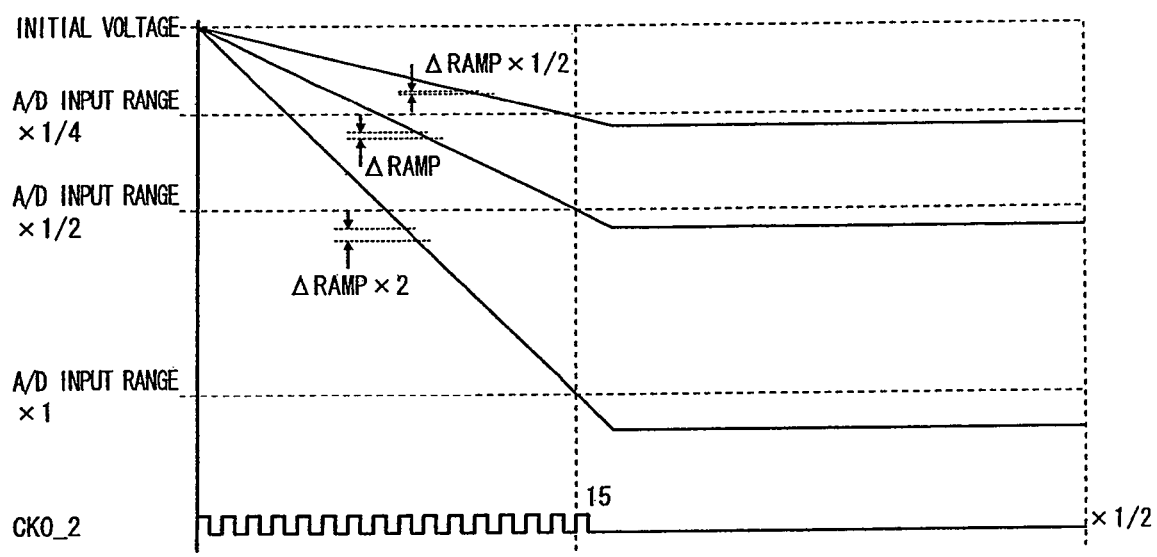
FIG. 14 shows a waveform of a reference signal according to the modification of the present invention.
Figure 15:
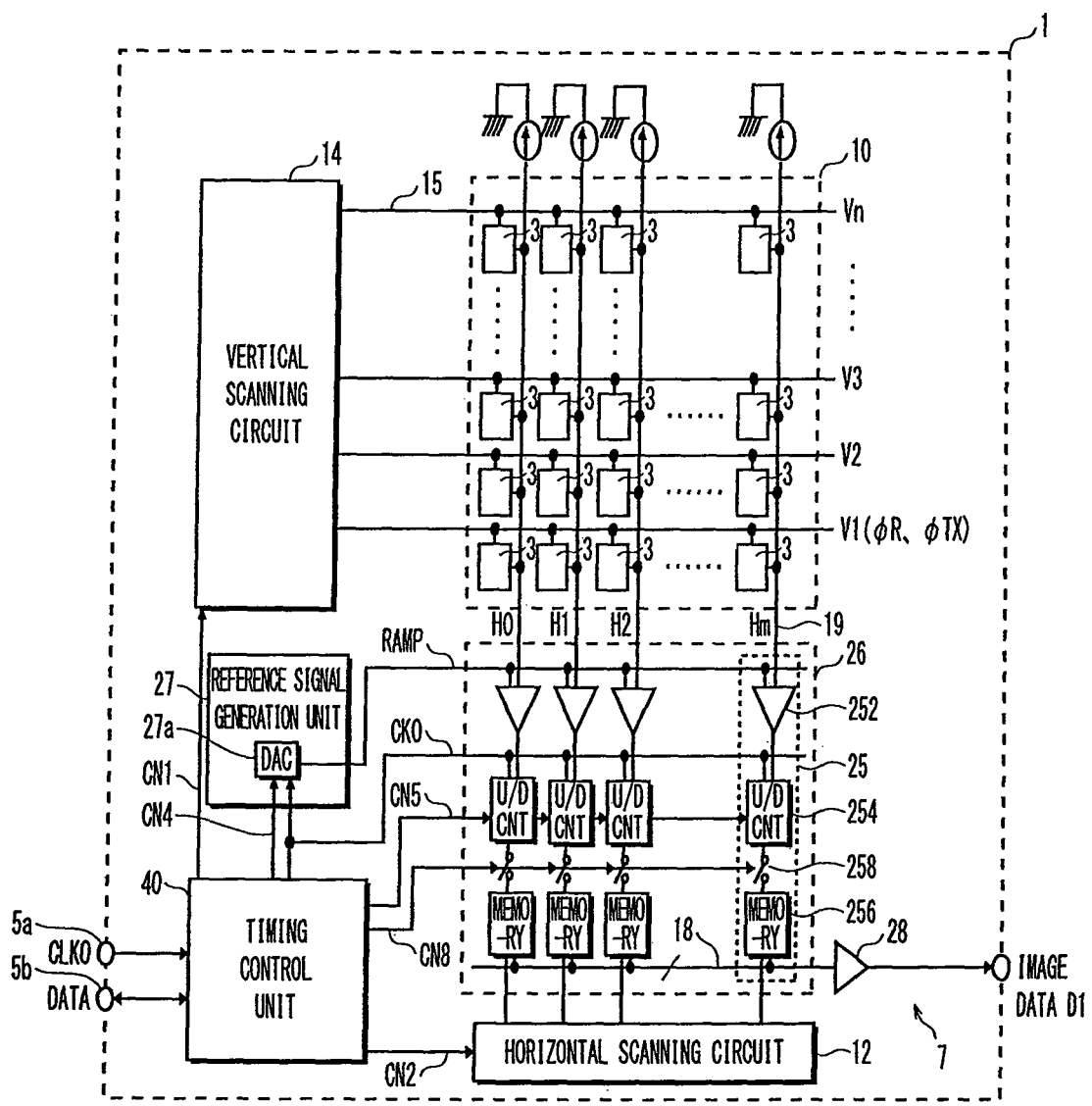
FIG. 15 is a schematic construction diagram of an image sensor shown in a conventional technique 1.

Note that the same effect as the present invention is obtained even when the slope of reference signal RAMP is linear, as long as the level of the signal RAMP temporally changes with a predetermined rate of change, as shown in FIG. 14.

In the above-described embodiments, the counter counts down when the reset component is shown, and counts up when the signal component is shown. However, if the reset component does not need to be subtracted, the counter does not need to count down. Furthermore, the counter does not need to have the construction of an up/down counter.

Also, the timing control unit 20 may execute an arbitrary drive mode such as a full image readout mode for a still image, a pixel mixture mode for a moving image, and a pixel-skipping mode, based on data from outside.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A solid-state imaging device comprising:
   a pixel array in which a plurality of pixels are arranged in rows and columns;
   a reference signal generation unit configured to generate a reference signal for each of horizontal periods, the reference signal changing monotonically for a predetermined period included in each of the horizontal periods;
   comparators that are arranged in correspondence with the columns of the pixel array, each of the comparators being configured to compare a level of a pixel signal output from a pixel in the corresponding column with a level of the reference signal;
   a counter configured to count input clock pulses; and
   a clock control unit configured to generate a clock that is to be input into the counter, and change frequency of the clock based on external input data, wherein
   the clock control unit changes the frequency of the clock in a manner that gain of the counter is changed to determined gain.

2. The solid-state imaging device of claim 1, wherein
   the clock control unit is further configured to generate a second clock that is to be input into the reference signal generation unit,
   the reference signal generation unit is further configured to adjust amount of change of the reference signal per the second clock.

3. The solid-state imaging device of claim 1, wherein
   the clock control unit changes the frequency of the clock and the reference signal generation unit adjusts amount of change of the reference signal per the second clock in a manner that gain of the counter is changed to determined gain.

4. The solid-state imaging device of claim 1, wherein
   the clock control unit further configured to change a length of a period for inputting the clock into the counter.

5. The solid-state imaging device of claim 1, wherein
   each of the plurality of pixels includes an amplification unit for amplifying a signal level, and
   the solid-state imaging device further comprising
   a current suppression unit configured to one of suppress and stop current flowing in either the amplification units or the comparators, from elapse of the period for inputting the clock into the counter to arrival of a next period for inputting the clock into the counter.

6. The solid-state imaging device of claim 1, further comprising
   a current suppression unit for suppressing current flowing in the comparator when the frequency of the clock is lower than a predetermined value.

7. The solid-state imaging device of claim 1, wherein
   the reference signal generation unit changes a rate of the temporal change of the reference signal.

8. The solid-state imaging device of claim 7, wherein
   the reference signal generation unit changes the rate of the temporal-change of the reference signal, in a manner gain of the counter is changed to determined gain.

9. The solid-state imaging device of claim 8, wherein
   the clock control unit is further configured to change a length of a period for inputting the clock into the counter, and change the period in a manner that the higher the frequency of the clock is, the shorter the period is.

10. The solid-state imaging device of claim 9, wherein
    each of the plurality of pixels includes an amplification unit for amplifying a signal level, and
    the solid-state imaging device further comprising
    a current suppression unit configured to one of suppress and stop current flowing in either the amplification units or the comparators, from elapse of the period for inputting the clock into the counter to arrival of a next period for inputting the clock into the counter.

11. The solid-state imaging device of claim 1, wherein
    the clock control unit changes the frequency of the generated clock by a unit of frame to be captured.

12. The solid-state imaging device of claim 1, wherein
    the reference signal generation unit generates the reference signal in synchronization with a reference clock having a predetermined frequency, so that the reference signal changes in stages over time, and
    the clock control unit generates the clock by dividing the predetermined frequency of the reference clock by m (m being an integer), so that the clock has a desired frequency.

13. A camera including the solid-state imaging device of claim 1.

14. The solid-state imaging device of claim 1, wherein
    the determined gain is changed in a manner that the brighter a brightness of a scene derived from a level of each of the pixel signals that have been output from the pixels, the higher the determined gain is.

15. A solid-state imaging device comprising:
    a pixel array in which a plurality of pixels are arranged in rows and columns;
    a counter configured to count input clock pulses;
    a clock control unit configured to generate a clock that is to be input into the counter, and change frequency of the clock based on external input data; and a plurality of analog-digital conversion units that are arranged in correspondence with the columns of the pixel array, each of the analog-digital conversion units being configured to obtain, for each pixel in a corresponding column, a number of counts as a digital value of a pixel signal output from a pixel in the corresponding column, the number of counts being counted by the counter during a period whose length is determined in accordance with an analog value of the pixel signal, wherein the clock control unit changes the frequency of the clock in a manner that gain of the counter is changed to determined gain.

16. The solid-state imaging device of claim 1, wherein the clock control unit set the frequency of the clock to a first frequency where the pixel signal is read as a moving image, and the clock control unit set the frequency of the clock to a second frequency where the pixel signal is read as a still image.

17. The solid-state imaging device of claim 1, wherein the determined gain is set to a first gain where the pixel signal is read as a moving image, the determined gain is set to a second gain where the pixel signal is read as a still image, and the first gain and the second gain are set by a unit of frame to be captured.

* * * * *